United States Patent [19]

Schmehl

[11] 3,905,537

[45] Sept. 16, 1975

[54] METHOD AND APPARATUS FOR COMPENSATING FOR SUBSTANCE VARIATIONS DURING LEAD FRAME BONDING

[75] Inventor: Glenn Lewis Schmehl, Morrisville, Pa.

[73] Assignee: Western Electric Company, Incorporated, New York, N.Y.

[22] Filed: July 8, 1974

[21] Appl. No.: 486,295

[52] U.S. Cl. ................ 228/180; 228/106; 228/185; 228/212; 228/243; 228/44.1; 29/626; 269/267

[51] Int. Cl.$^2$ ...................... B23K 19/00; H05K 3/34

[58] Field of Search ....... 29/626, 493, 471.1, 471.3, 29/203 B; 269/22, 266, 267; 228/44; 219/161

[56] References Cited

UNITED STATES PATENTS

| | | | |
|---|---|---|---|
| 2,685,629 | 8/1954 | Peck | 219/161 X |
| 3,580,460 | 5/1971 | Lipschutz | 29/470.1 X |
| 3,589,591 | 6/1971 | Schwenn | 228/44 |
| 3,608,809 | 9/1971 | Cushman | 228/44 |
| 3,729,810 | 5/1973 | Piechocki | 29/493 |

FOREIGN PATENTS OR APPLICATIONS

| | | | |
|---|---|---|---|
| 854,050 | 10/1970 | Canada | 269/22 |
| 783,486 | 4/1935 | France | 228/44 |

*Primary Examiner*—Donald G. Kelly
*Assistant Examiner*—K. J. Ramsey
*Attorney, Agent, or Firm*—E. W. Pfeifle

[57] ABSTRACT

Lead frames are bonded to thin-film bonding sites on brittle substrates by a bonder which compensates for, inter alia, substrate contour variations to substantially reduce substrate cracking. The bonder includes, for each bonding site, a separate pair of lever arms registered both with said bonding site and the associated lead to be bonded thereto, the arms of each pair being mounted on separate parallel shafts and in parallel with corresponding arms of other pairs. An operating means concurrently rotates the arms independently around their respective shafts and into contact with the substrate and leads before an equal bonding force is simultaneously applied to each bonding site.

13 Claims, 4 Drawing Figures

METHOD AND APPARATUS FOR COMPENSATING FOR SUBSTANCE VARIATIONS DURING LEAD FRAME BONDING

BACKGROUND OF THE INVENTION

1. Field of the Invention

The present invention relates to a method and apparatus for simultaneously bonding a plurality of leads to a plurality of bonding sites on a planar article, such as a thin-film circuit on a ceramic substrate, while compensating for, inter alia, any waviness or non-uniformity of thickness in the planar article.

2. Description of the Prior Art

In the bonding of lead frames to thin-film circuits on brittle planar articles, such as for example ceramic substrates, it is known that the articles have a tendency to crack from stresses introduced by the applied bonding load when the articles have wavy surfaces or non-uniform thicknesses. To minimize stresses in the substrates during the bonding operation, various means of compensation have been proposed and used. In providing compensation for irregular substrates during the bonding process, additional difficulties are introduced by the fact that thin-film circuits have very closely spaced leads.

A system of compensation was disclosed in U.S. Pat. No. 3,669,806 issued to R. H. Cushman on Sept. 28, 1971. There, three alternative arrangements are provided to compensate for workpiece irregularities. In the first arrangement, a viscous medium is sealed in a chamber by a diaphragm to provide a compensating bonding tip and/or compensating base. During the bonding operation, the diaphragm flexes to compensate for workpiece irregularities while the viscous medium distributes the bonding pressure across the diaphragm to apply a substantially uniform bonding pressure at each bonding site.

In the second arrangement disclosed in the Cushman patent, a ductile material is confined in a chamber and an apertured plate locates and retains a plurality of pins at desired positions on the ductile material. During the bonding operation, the pins apply bonding pressure to selected bonding sites and are independently displaceable to compensate for workpiece irregularities. The confined ductile material acts as a fluid and in effect hydraulically interconnects the pins to uniformly distribute the bonding pressure thereto. In the third arrangement disclosed in the Cushman patent, resilient pins are provided to compensate for workpiece irregularities, or the pins are mounted on a resilient mat to provide the necessary compensation.

U.S. Pat. No. 3,729,810 issued to B. Piechocki on May 1, 1973 discloses a compensating base for lead frame bonding. There, the compensating base includes a series of cantilever spring elements extending from a rigid support, each of the elements corresponding in location to a different desired bonding site. During bonding, the spring elements deflect to compensate for any substrate irregularity.

In the compensating arrangements of the prior art, under some circumstances small stresses may still be produced in the substrate by the initial application of sufficient forces to deflect either the viscous medium, resilient pins or mat, or spring elements before a substantially uniform bonding force is simultaneously applied to each bonding site. The stresses that may be produced in the substrate by the compensating arrangements obviously would be much less in magnitude than the stresses produced by non-compensating systems, and, therefore, the tendency for a substrate to crack under the bonding load is substantially reduced.

Bonding operations in the past have also attempted to reduce substrate cracking by using slower speeds or by bonding only one lead at a time. Such bonding operations, however, clearly are disadvantageous when high volume production is desired.

Although the prior art hereinabove specifically discussed represents a considerable advance in the bonding art, yet it is desirable to provide a method and apparatus which will simultaneously bond a plurality of leads to a substrate, compensate for, inter alia, substrate irregularities during the bonding operation, and eliminate, or at least substantially further reduce, the stresses which may be produced by prior art compensating systems, especially during the initial compensation step in the bonding process. Although it is desirable to eliminate or substantially further reduce stresses in the substrate to prevent cracking, it is also desirable for each bonding site to see as nearly identical bonding conditions (load, temp., etc.) in order to improve bond strength uniformity and quality.

SUMMARY OF THE INVENTION

It is, therefore, an object of the present invention to provide an improved method and apparatus for concurrently bonding a plurality of closely spaced leads to a brittle substrate having a wavy surface or non-uniform thickness, or other irregulatities in the substrate or in the leads, wherein the tendency of the substrate to crack will be substantially reduced.

Other and further objects of the present invention will become apparent during the course of the following description and by reference to the accompanying drawings and the appended claims.

These and other objectives are achieved by providing a bonder which includes a plurality of pairs of bonding tips, one pair for each bonding site and lead to be bonded thereto, the bonding tips being independently movable toward engagement with that face of the article opposite the bonding site thereon and toward the leads to be bonded to said bonding sites, means being provided to apply a substantially uniform bonding force through the bonding tips simultaneously to bond the leads to their respective bonding sites after the bonding tips have initially contacted the article and the leads.

DESCRIPTION OF THE DRAWINGS

Referring now to the drawings in which like numerals represent like parts in the several views.

DESCRIPTION OF THE PREFERRED EMBODIMENT

Figure 1:
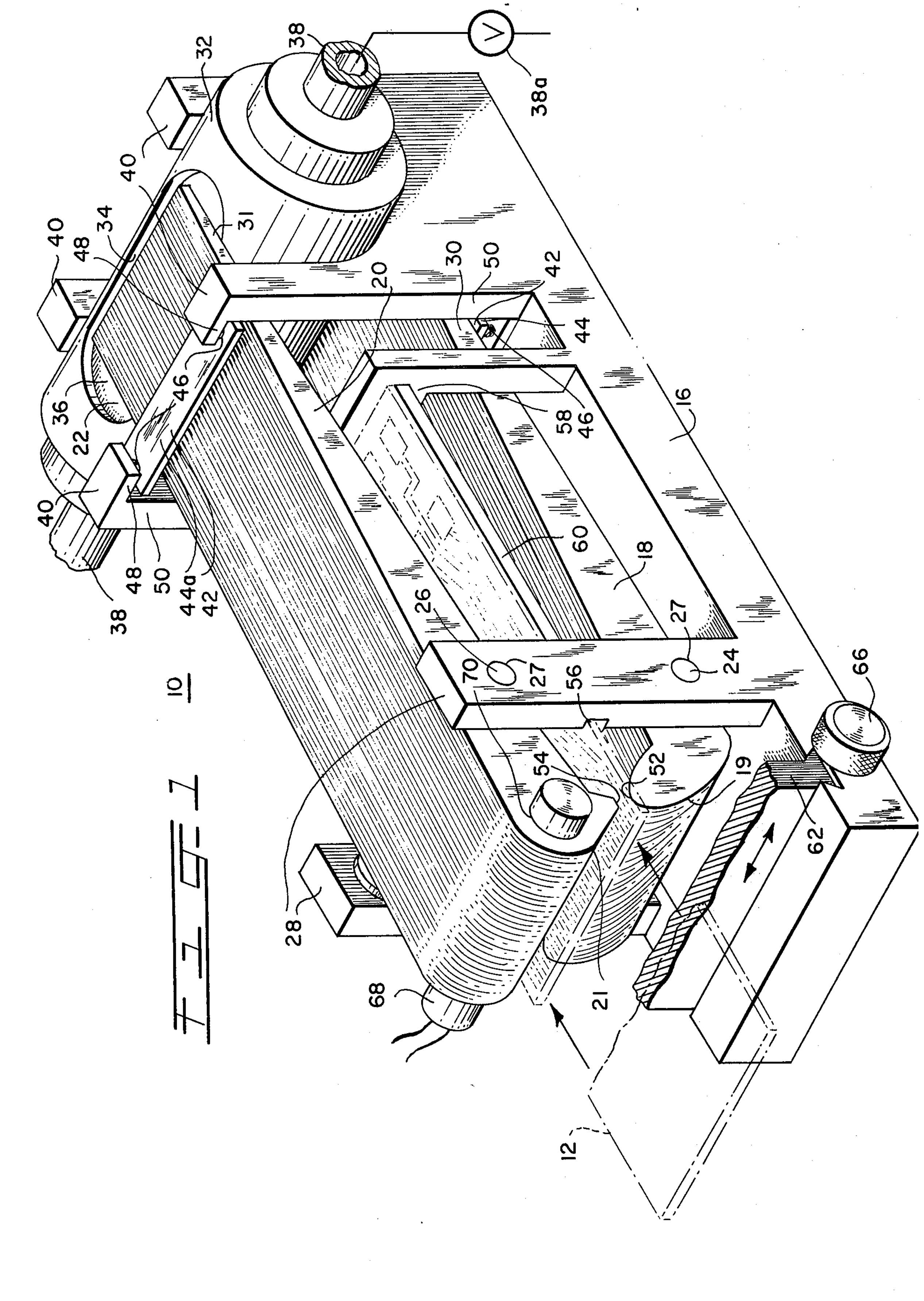
FIG. 1 is a view in perspective of a bonder according to the present invention with a portion of a lead frame holder removed for purposes of clarity.

In FIGS. 1 to 4 there is shown a bonder, designated generally by the numeral 10, for simultaneously bonding a plurality of leads 14 (shown in FIGS. 3 and 4) to a thin-film circuit on a brittle ceramic substrate 12, the bonder 10 being adapted to compensate for irregularities such as variations in lead thickness, variations in land area thickness, lack of parallelism between the substrate and the bonding tool, substrate waviness, substrate warpage, and non-uniform substrate thickness.

Bonder 10 comprises a base 16, a plurality of paired lever arms including a first lever arm 18 and a second lever arm 20 forming each pair, and operating means 22 for simultaneously activating each of the paired lever arms 18 and 20 to bond the leads 14 to bonding sites on the ceramic substrate 12. All of the first lever arms 18 are mounted near their first ends 19 on a fixed first shaft 24 for independent rotation in a direction normal to the longitudinal axis of the first shaft 24. All of the second lever arms 20 are mounted near their first ends 21 on a fixed second shaft 26 for independent rotation in a direction normal to the longitudinal axis of the second shaft.

First and second shafts 24 and 26, including the associated lever arms 18 and 20, respectively, are mounted parallel to each other in apertures 27 in projections 28, which form a part of base 16. Each pair of associated lever arms 18 and 20 lies in a plane which is normal to the plane formed by the longitudinal axes of the first and second shafts 24 and 26.

To rotate the paired lever arms 18 and 20 around their respective shafts 24 and 26 thereby to decrease the distance between their respective first ends 19 and 21, operating means 22 is positioned between second ends 30 and 31, respectively, of the first and second lever arms 18 and 20. Operating means 22 can be of any design which, when actuated, increases the distance between second ends 30 and 31 of each pair of lever arms 18 and 20 and thereby causes the simultaneous independent rotation of each of the first and second lever arms 18 and 20 around the first and second shafts 24 and 26. In the preferred embodiment of the present invention, operating means 22 comprises a tubular cylinder 32 having to diametrically opposed, longitudinally elongated openings 34, and a thin-walled expandable tube 36, which can, for example, be a plastic tube, positioned within cylinder 32. Expandable tube 36 has an outside diameter which approximates the inside diameter of cylinder 32 to allow tube 36 to contact the inner surface of the cylinder 32 and to span elongated openings 34 when positioned within cylinder 32. The ends of cylinder 32 are capped and connected via pipes 38 to a source of pressurized fluid (not shown). Pressure regulating means (e.g., control valve 38a) is provided for controlling the pressure of the fluid introduced into both cylinder 32 and expandable tube 36 through pipes 38, whereby to inflate and expand or selectively to deflate and contact the tube 36.

Cylinder 32 is cradled at the bottoms of spaced U-shaped projections 40, forming a part of base 16, and is positioned between second ends 30 and 31 of lever arms 18 and 20, respectively. Set screws 41 can be threadedly mounted in threaded apertures in the legs of projections 40 to engage cylinder 32 and thereby secure cylinder 32 to projections 40. Elongated openings 34, formed in cylinder 32 and spanned by expandable tube 36, are shaped to permit all second ends 30 and 31 of lever arms 18 and 20, respectively, to contact tube 36 without engaging the perimeters of openings 34.

A biasing means 42 is provided to engage lever arms 18 and 20 and maintain second ends 30 and 31 of lever arms 18 and 20, respectively, in contact with tube 36, especially during the non-operating periods of bonder 10. Biasing means 42 can, of course, be positioned anywhere along lever arms 18 and 20 and can comprise well-known form. The biasing means 42 shown in FIGS. 1 to 3 comprises a rectangular member 44 associated with all first lever arms 18 and a second rectangular member 44*a* associated with all second lever arms 20, and at least one spring 46 mounted between each end of members 44 and 44*a* and an ear 48 extending perpendicularly inwardly from each end of forward arm 50 of U-shaped projections 40 under and over lever arms 18 and 20, respectively. Springs 46 exert a light force at all times on members 44 and 44a and in such a direction as to both engage each member 44 and 44*a* with its associated lever arms and to maintain continuous contact between the second ends 30 and 31 of first and second lever arms 18 and 20, respectively, and tubing 36 of operating means 22. It will be seen that, during the non-operating period between bonding operations, biasing means 42 maintains the distance between second ends 30 and 31 of lever arms 18 and 20, respectively, at a minimum and the distance between first ends 19 and 21 of lever arms 18 and 20, respectively, at a maximum for ease of loading into the bonder 10 the next substrate 12 and lead frame 14 to be bonded.

Figure 4:
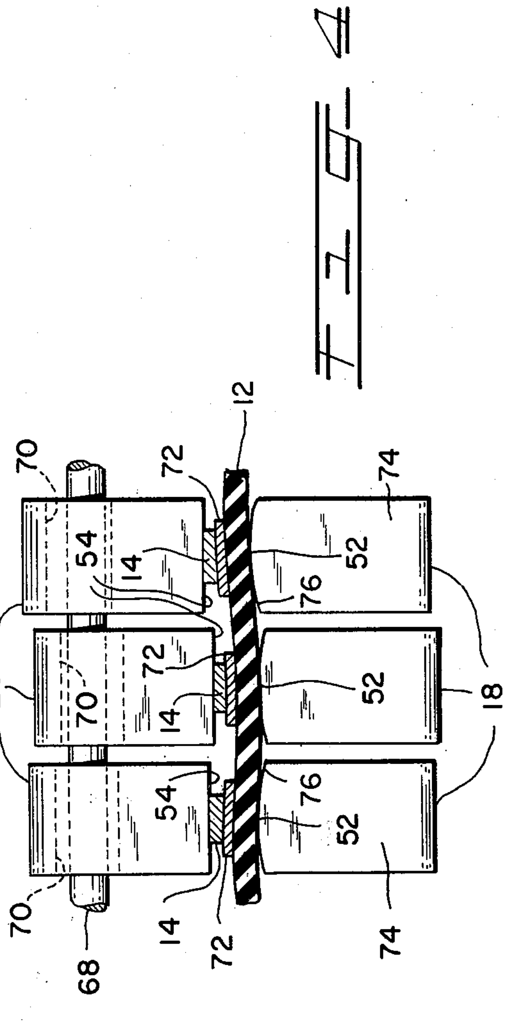
FIG. 4 is a view in front elevation of a portion of the bonder showing three pairs of lever arms compensating for substrate irregularities during the bonding operation.

To bond a plurality of leads 14 to a plurality of bonding sites 72 on substrate 12, lever arms 18 and 20, of each pair thereof, should be both aligned perpendicular to an associated bonding site 72 and have a width which extends over the associated bonding site 72 but does not overlap an adjacent bonding site 72 (FIG. 4). Once the paired lever arms 18 and 20 are properly arranged on shafts 24 and 26 to match the bonding site pattern on a particular type of substrate 12, advantageously means are provided to properly register the substrate 12 and the individual bonding sites 72 thereon between bonding tips 52 and 54 on first ends 19 and 21 of paired lever arms 18 and 20, respectively. One means for properly mounting and registering subtrate 12 between the paired lever arms 18 and 20 comprises a slot 56 in the inwardly facing surface of each first projection 28 adjacent lever arms 18 and 20. Slots 56 have a separation which corresponds to the width of substrate 12 and define a plane therebetween which is normal to the plane defined by the longitudinal axes of shafts 24 and 26. The registering means further comprises a backstop 58 which extends across first lever arms 18, and a pair of parallel ledges 60, each ledge 60 extending rearwardly from the forward edge (i.e., that edge nearest bonding tips 52 and 54) of one of the slots 56 to engage backstop 58 and form a support for a substrate 12. When a substrate 12 is placed in slots 56 and on ledges 60 and moved rearwardly to engage backstop 58, the bonding sites 72 on substrate 12 will be properly registered with respect to their associated paired bonding tips 52 and 54. Alternatively, longitudinal guides (not shown) can be formed on ledges 60 to contact the sides of substrate 12 when positioned on the registering means to avoid any possible skewing of substrate 12 in relation to bonding tips 52 and 54. It is, of course, within the scope of the present invention to use any form of registering means which will similarly align substrate 12 and the bonding sites 72 thereon with the bonding tips 52 and 54 of lever arms 18 and 20, respectively.

A dovetailed slide 62 is provided on base 16 in front of, and perpendicular to, lever arms 18 and 20 to align leads 14, which may be, for example, part of a lead frame, with bonding sites 72 on a substrate 12 properly positioned on the registration means. A platform 64, on dovetailed slide 62, is provided with means (not shown but known to those familiar with this art), such as fixed, properly spaced, pins, for temporarily mounting a lead frame thereon in a position which accurately extends the bonding areas of leads 14 over the bonding sites 72 on a substrate 12 positioned on the registration means. When a lead frame is positioned on platform 64, a vernier drive 66, connected to dovetailed slide 62, permits lateral movement of slide 62 parallel to the line of bonding tips 52 and 54 to properly register each lead 14 with the respective bonding site 72 on substrate 12.

To provide sufficient heat for thermocompression bonding of leads 14 to the registered bonding sites 72 on substrate 12, a cartridge heater 68, connected to an external source of electrical energy (not shown), is positioned centrally within corresponding apertures 70 in each of second lever arms 20. Apertures 70 have a diameter which is larger than the diameter of heater 68 to permit a limited amount of free movement by each second lever arm 20 about shaft 26 without the lever arm touching heater 68 or affecting other second lever arms 20 (FIG. 4). When second lever arms 20 are aligned parallel to each other on shaft 26, apertures 70 form a tunnel wherein heater 68 is positioned. To centrally position heater 68 in apertures 70 and to conduct the heat produced by heater 68 to all second lever arms 20 and bonding tips 54, a pliable heat absorbing and transmitting compound, such as a grease known to those familiar with this art, is packed in apertures 70 between heater 68 and the surface of apertures 70. It is also possible to similarly add a heater to lever arms 18 if it is desirable to alter the heat flow through the bonding tips 54, the leads 14, and the substrate 12.

Figure 2:
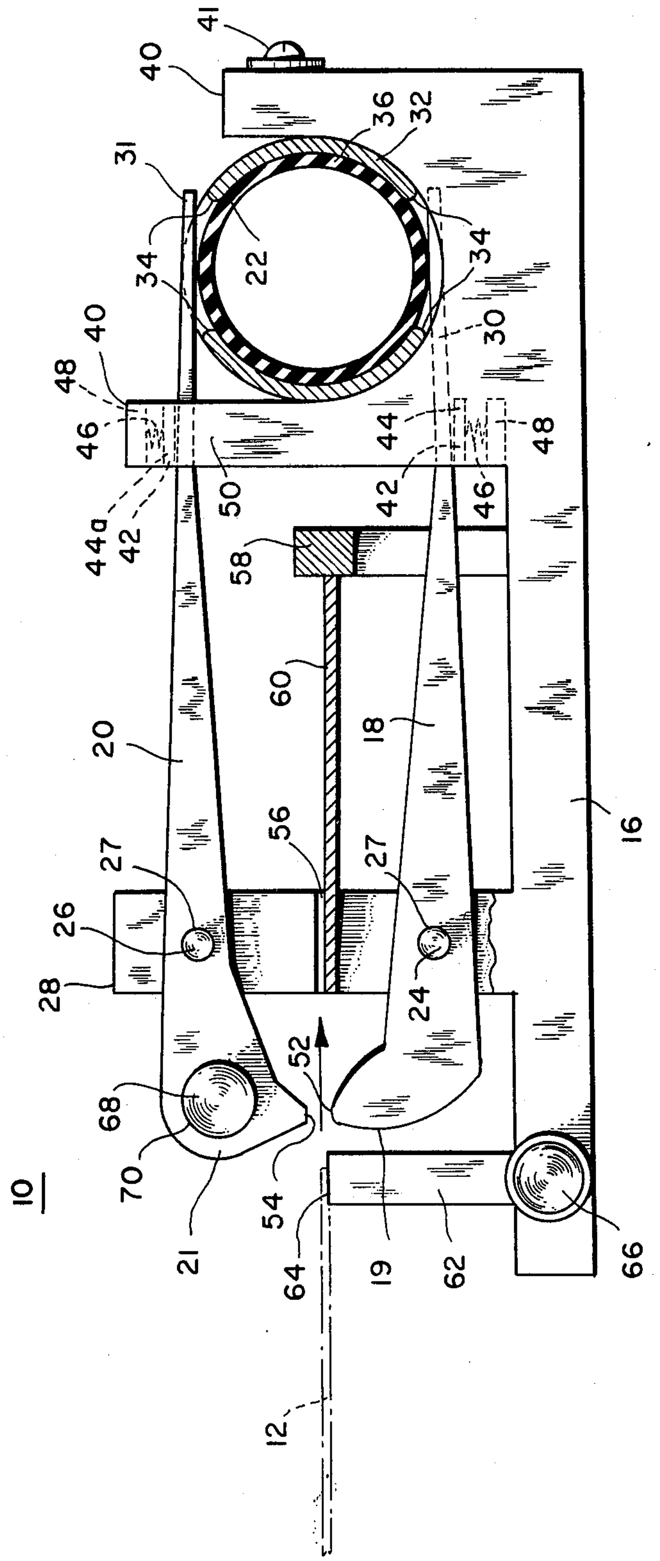
FIG. 2 is a partially sectional view in side elevation showing the bonder in its non-operating state.

To position substrate 12 and the plurality of leads 14 on bonder 10, bonder 10 should initially be in the non-operating state, as shown in FIG. 2, with no pressure, or with reduced pressure, in expandable tube 36 and the first ends 19 and 21 of lever arms 18 and 20, respectively, spread apart by the action of biasing means 42. A substrate 12 is moved, in the direction shown by the arrow in FIG. 2, through slots 56, over ledges 60, and against backstop 58 to register each bonding site 72 on substrate 12 with the corresponding bonding tips 52 and 54 of respective lever arms 18 and 20. It will be understood that bonding tips 52 and 54 may be formed integrally with first ends 19 and 21 of their respective lever arms 18 and 20; alternatively, bonding tips 52 and 54 may be separately formed and then attached to said first ends 19 and 21, respectively. A lead frame is mounted on platform 64 of slide 62 to position leads 14 in a proper alignment with the bonding sites 72 on substrate 12. Vernier drive 66 is actuated, if necessary, to move slide 62, and the lead frame thereon, laterally on base 16 to centrally register each lead with the associated bonding sites 72 on substrate 12.

Figure 3:
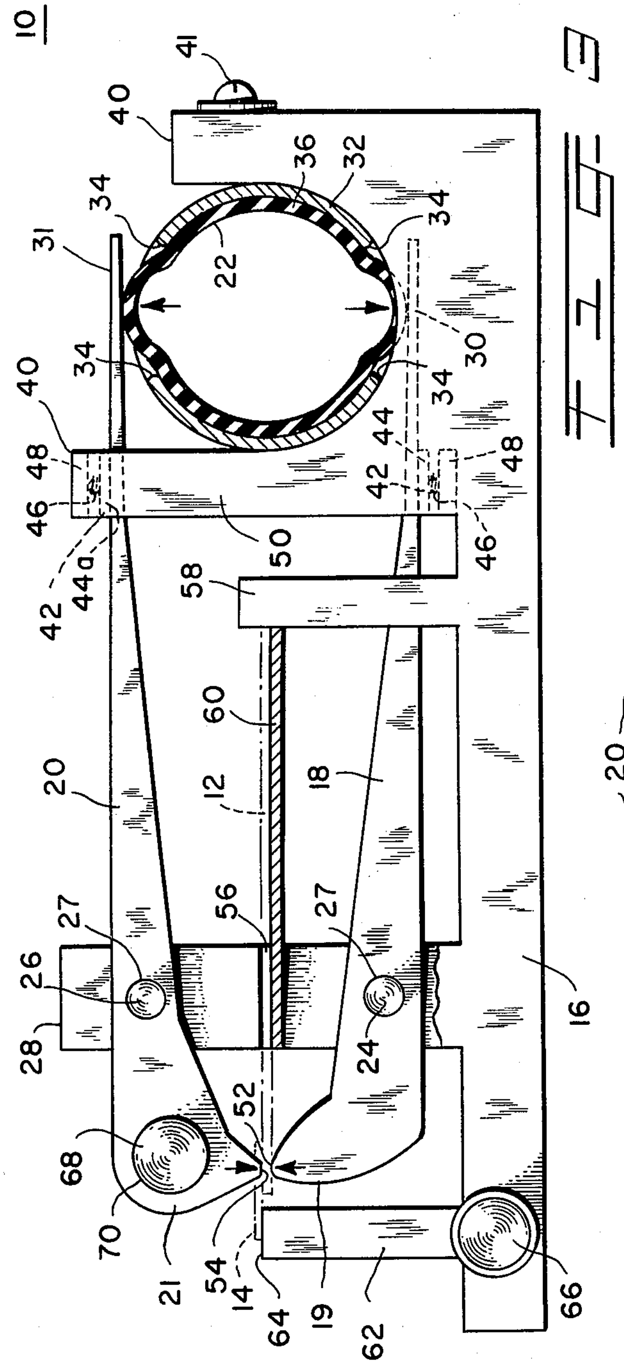
FIG. 3 is a partially sectional view in side elevation showing the bonder in its operating state.

Once proper registration is attained between associated bonding tips 52 and 54, bonding sites 72, and leads 14, pressure regulating means 38*a* is operated to increase fluid pressure in tube 36 thereby to inflate and expand tube 36, as shown by arrows in FIG. 3. Inflation of tube 36 causes tube 36 to expand and bulge through elongated openings 34 and rotate each first and second lever arm 18 and 20 freely around respective shafts 24 and 26, in the direction shown by the arrows at lever arm ends 19 and 21, against the urging of biasing means 42. Biasing means 42 remains in contact only with the lever arms that rotate the greatest amount to engage bonding tips 52 and 54 thereof with the adjacent surface of substrate 12 or lead 14. By using an expandable tube 36 inflated and expanded by fluid pressure, each of the first and second lever arms 18 and 20 are initially placed in contact with the substrate 12 and the associated lead 14, respectively, before any bonding force is applied at a bonding site 72 by the lever arms 18 and 20. As the pressure in tube 36 is further increased, an equal bonding force is applied simultaneously through lever arms 18 and 20 to each bonding site 72. Once bonding is completed, the pressure is reduced in tube 36 to deflate and contract tube 36 and thereby to restore bonder 10 to its non-operating state before the bonded leads 14 and substrate 12 are removed.

During bonding, as shown in FIG. 4, each first lever arm 18 engages the surface of substrate 12 opposite the associated thin-film bonding site 72 to support the substrate bonding area while each second lever arm 20 engages associated lead 14. To both avoid the possible introduction of stresses in substrate 12 and centralize the support under each bonding site 72, advantageously bonding tips 52 of first lever arms 18 each comprises a convex surface when viewed from the side (FIGS. 2 or 3) or front (FIG. 4) of the lever arm 18. As can be seen from FIG. 4, when a substrate 12 has a wavy thickness, each first lever arm 18 properly supports the substrate 12 below the associated bonding site 72. If the surfaces of the bonding tips 52 of first lever arms 18 were planar instead of having the slightly convex configuration described, the bonding tips 52 of the two first lever arms 18 (designated as 74 in FIG. 4) adjacent opposite sides of a particular first lever arm 18 might contact substrate 12 along those edges 76 of the two just mentioned first lever arms 18 closest to the particular first lever arm 18 and this, in turn, might under some circumstance introduce stress in substrate 12 by the misaligned contact points of bonding tips 52 and 54 of the paired lever arms 18 and 20, respectively. Inasmuch as bonding tip 54 of second lever arm 20 contacts lead 14, which is registered with bonding site 72, each bonding tip 54 can have a flat surface when viewed from the front or sise of the second lever arm.

The use of separate first and second lever arms for each bonding site eliminates the use of the prior art single bonding rail to bond a plurality of leads to a plurality of bonding sites on a substrate, thereby substantially eliminating the possibility of the bonding rail distorting due to non-uniform heating and introducing stresses in the substrate. The use of separate first and second lever arms also provides nearly identical bonding conditions at each bonding site to improve bond strength uniformity and quality.

Although the drawings and accompanying description have shown and described the preferred embodiment of the present invention as a thermocompression bonder, it should be apparent to those skilled in the art that the present invention is also applicable to forms of bonding other than just thermocompression bonding.

What is claimed is:

1. Method of bonding a plurality of leads to respective bonding sites on one face of a substantially planar article, said method comprising:

a. providing a plurality of first bonding tips, one for each bonding site, adapted to engage the other face of said article opposite the bonding sites;

b. providing a plurality of second bonding tips, one for each bonding site, adapted to engage said leads;

c. registering each of the bonding sites between the first and second bonding tips associated therewith;

d. registering each of the leads with its respective bonding site and between the said bonding site and the second bonding tip associated therewith;

e. concurrently and independently moving each of said first bonding tips toward engagement with that face of said article opposite said bonding sites and each of said second bonding tips toward engagement with their respective leads; and f. after said first bonding tips have been independently engaged with the other face of said article opposite said bonding sites and said second bonding tips have been independently engaged with their respective leads, applying a substantially uniform bonding pressure with said first and second bonding tips concurrently to all of said leads and bonding sites, thereby to concurrently bond all of said leads to their respective bonding sites.

2. Method as in claim 1, wherein:

g. in performing step e. said first and second bonding tips are moved in a plane perpendicular to the plane of the bonding sites.

3. Method as in claim 1, wherein each of said first bonding tips is mounted on a respective first lever arm, all of said first lever arms being rotatably mounted on a first shaft, and each of said second bonding tips is mounted on a respective second lever arm, all of said second lever arms being rotatably mounted on a second shaft, said method further comprising:

g. in performing step (e), said first lever arms are independently rotated about said first shaft and said second lever arms are independently rotated about said second shaft.

4. Apparatus for bonding a plurality of leads to respective bonding sites on one face of an article, said apparatus comprising:

a. a plurality of first bonding tips, one for each bonding site, adapted to engage the other face of said article opposite the bonding sites;

b. a plurality of second bonding tips, one for each bonding site, adapted to engage said leads; and c. means adapted to concurrently and independently move said first bonding tips toward engagement with the other face of said article opposite said bonding sites and said second bonding tips toward engagement with their respective leads and thereafter to apply a substantially uniform bonding pressure through said first and second bonding tips concurrently to all of said leads and bonding sites thereby concurrently to bond all of said leads to their respective bonding sites.

5. Apparatus as in claim 4, further comprising:

d. registration means to register each of the bonding sites on said article between its respective first and second bonding tips.

6. Apparatus as in claim 4, further comprising:

d. registration means to register each of the bonding sites on said article between its respective first and second bonding tips and each of said leads between its respective bonding site on said article and its respective second bonding tip.

7. Apparatus for bonding a plurality of leads to respective bonding sites on an article, said apparatus comprising:

a. a plurality of first lever arms, one for each bonding site, each first lever arm having a first end and a second end;

b. a plurality of first bonding tips, one for each bonding site, each first bonding tip being mounted to the first end of a separate one of said first lever arms, said first bonding tips being adapted to engage that face of said article opposite the associated bonding sites;

c. a first shaft;

d. said plurality of first lever arms being mounted on said first shaft between the first and second ends of said first lever arms, each first lever arm being rotatable on said first shaft independently of the other first lever arms;

e. a plurality of second lever arms, one for each bonding site, each second lever arm having a first end and a second end being associated with one of said first lever arms;

f. a plurality of second bonding tips, one for each bonding site, each second bonding tip being mounted to the first end of a separate one of said second lever arms, said second bonding tips being adapted to engage said associated leads;

g. a second shaft;

h. said plurality of second lever arms being mounted on said second shaft between the first and second ends of said second lever arms, each second lever arm being rotatable on said second shaft independently of the other second lever arms; and i. operating means adapted to independently rotate all of said first lever arms around said first shaft concurrently to move all of said first bonding tips toward engagement with that face of said article opposite said bonding sites and all of said second lever arms around said second shaft concurrently to move all of said second bonding tips toward engagement with their respective leads and to apply a substantially uniform bonding pressure through said first and second bonding tips to all of said leads and bonding sites thereby concurrently to bond all of said leads to their respective bonding sites.

8. Apparatus as in claim 7, further comprising:

j. registration means to register each of the bonding sites on said article between its respective first and second bonding tips.

9. Apparatus as in claim 7, further comprising:

j. registration means to register each of the bonding sites on said article between its respective first and second bonding tips and each of said leads between its respective bonding site on said article and its respective second bonding tip.

10. Apparatus as in claim 7, said operating means comprising:

j. fluid-pressure expandable means interposed between the second ends of said first and second lever arms.

11. Apparatus as in claim 7, said operating means comprising:

j. a cylinder having a first elongated aperture therethrough adjacent the second end of all of said first lever arms and a diametrically opposed second elongated aperture therethrough adjacent the second end of all of said second lever arms;

k. a fluid-pressure expandable element mounted within said cylinder; and l. control means connectable to said fluid-pressure expandable elements and adapted to increase the fluid pressure therein thereby expanding said element to bulge through the first and second elongated apertures to engage the second ends of said first and second lever arms to rotate said first and second lever arms about said first and second shafts, respectively, or selectively to decrease the fluid pressure in said element thereby to contract said element.

12. Apparatus as in claim 7, further comprising:

j. biasing means to urge the second ends of said first and second lever arms into engagement with said operating means.

13. Apparatus as in claim 7, each first bonding tip having, at that portion thereof adapted to engage said article, a convex profile.

* * * * *

UNITED STATES PATENT OFFICE
CERTIFICATE OF CORRECTION

Patent No. 3,905,537 Dated September 16, 1975

Inventor(s) G. L. SCHMEHL

It is certified that error appears in the above-identified patent and that said Letters Patent are hereby corrected as shown below:

In the Title, "substance variations" should read --substrate variations--.

In the specification, column 3, line 43, "to" should read --two--; line 57, "contact" should read --contract--. Column 4, line 8, "comprise" should read --comprise any--. Column 6, line 45, "stress" should read --a stress--; line 51, "sise" should read --side--.

In the claims, column 7, claim 2, lines 30-31, "step e." should read --step (e),--. Column 9, claim 11, line 9, "elements" should read --element--.

Signed and Sealed this

*ninth* Day of *December 1975*

[SEAL]

*Attest:*

RUTH C. MASON
*Attesting Officer*

C. MARSHALL DANN
*Commissioner of Patents and Trademarks*